US008631369B1

(12) United States Patent
Kariat et al.

(10) Patent No.: US 8,631,369 B1
(45) Date of Patent: Jan. 14, 2014

(54) METHODS, SYSTEMS, AND APPARATUS FOR TIMING AND SIGNAL INTEGRITY ANALYSIS OF INTEGRATED CIRCUITS WITH SEMICONDUCTOR PROCESS VARIATIONS

(75) Inventors: Vinod Kariat, Sunnyvale, CA (US); Joel R. Phillips, Oakland, CA (US); Igor Keller, Pleasanton, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 77 days.

(21) Appl. No.: 12/981,504

(22) Filed: Dec. 30, 2010

Related U.S. Application Data

(62) Division of application No. 11/560,261, filed on Nov. 15, 2006, now Pat. No. 7,882,471.

(60) Provisional application No. 60/737,109, filed on Nov. 15, 2005.

(51) Int. Cl.
*G06F 17/50* (2006.01)

(52) U.S. Cl.
USPC .......................... 716/113; 716/101; 716/104

(58) Field of Classification Search
USPC ........................... 716/101, 104, 113
See application file for complete search history.

(56) References Cited

U.S. PATENT DOCUMENTS

| 6,058,252 | A  | * | 5/2000  | Noll et al. ..................... 716/113 |
| 6,226,757 | B1 | * | 5/2001  | Ware et al. ..................... 713/503 |
| 6,480,991 | B1 |   | 11/2002 | Cho et al. |
| 7,359,843 | B1 |   | 4/2008  | Keller et al. |
| 7,653,884 | B2 |   | 1/2010  | Furnish et al. |
| 7,882,471 | B1 |   | 2/2011  | Kariat et al. |

OTHER PUBLICATIONS

Chang, H.; Sapatnekar, S. "Statistical Timing Analysis Considering Spatial Correlations Using a Single Pert-Like Traversal." University of Minnesota. 2003. pp. 1-5.
Visweswariah, C.; Ravindran, K.; Kalafala, K.; Walker, S.G; Narayan, S.; "First-order Incremental Block-Based Statistical Timing Analysis." DAC 2004. San Diego, CA. pp. 1-6.
Scheffer, L. "Explicit Computation of Performance as a Function of Process Variation." TAU 2002. Monterey, CA. pp. 1-8.

* cited by examiner

*Primary Examiner* — Thuan Do
(74) *Attorney, Agent, or Firm* — Alford Law Group, Inc.

(57) ABSTRACT

In one embodiment of the invention, a method of statically analyzing an integrated circuit with process and environment variations is provided. The method includes characterizing each circuit cell of a cell library for a sensitivity to process parameter variations within a predetermined range; creating a timing graph corresponding to a netlist representing an integrated circuit design; along nodes of the timing graph, computing delay values including sensitivities to process variations; for each selected output node of the netlist, propagating a full timing value function with the sensitivities to the selected output nodes; and generating a parameterized timing report including the sensitivities to the process variations.

7 Claims, 9 Drawing Sheets

METHODS, SYSTEMS, AND APPARATUS FOR TIMING AND SIGNAL INTEGRITY ANALYSIS OF INTEGRATED CIRCUITS WITH SEMICONDUCTOR PROCESS VARIATIONS

CROSS-REFERENCE TO RELATED APPLICATIONS

This non-provisional U.S. patent application is a divisional and claims the benefit of U.S. patent application Ser. No. 11/560,261 entitled TIMING AND SIGNAL INTEGRITY ANALYSIS OF INTEGRATED CIRCUITS WITH SEMICONDUCTOR PROCESS VARIATIONS" filed on Nov. 15, 2006 by Vinod Kariat et al, now allowed. U.S. patent application Ser. No. 11/560,261 claims the benefit of U.S. Provisional Patent Application No. 60/737,109 entitled "TIMING AND SIGNAL INTEGRITY ANALYSIS OF INTEGRATED CIRCUITS WITH SEMICONDUCTOR PROCESS VARIATIONS" filed on Nov. 15, 2005 by Vinod Kariat et al.

FIELD

The embodiments of the invention relate generally to electronic design automation (EDA) for integrated circuits. More particularly, the embodiments of the invention relate to static timing analysis of integrated circuits with consideration for semiconductor process and environmental variations.

BACKGROUND

Designing and manufacturing semiconductor integrated circuits is a challenge. Variations in semiconductor processing of an integrated circuit can cause changes in its performance and yield. In nanometer technologies, the performance of a given semiconductor chip can vary as much 30% due to process variations. The performance of a chip is also affected by environmental variations, such as variations in temperature or supply voltage. It is desirable to consider semiconductor processing variations in the design of the integrated circuit, including when performing a static timing analysis of the integrated circuit.

BRIEF SUMMARY

The embodiments of the invention are best summarized by the claims that follow below. However in one embodiment of the invention, an integrated circuit design system includes a synthesizer, a place and router, an extractor coupled to the place and router, and a variation aware static timing analyzer coupled to the synthesizer. The synthesizer generates a circuit netlist in response to a description of the logical function of an integrated circuit and a circuit cell library. The place and router generates graphical patterns of mask layers of each device and interconnecting wire of the integrated circuit in response to the circuit netlist and the circuit cell library. The extractor extracts parasitic devices of the integrated circuit in response to the graphical patterns of the mask layers, the circuit netlist and the circuit cell library. The place and router, and the extractor, the variation aware static timing analyzer propagate a plurality of arrival time functions through the circuit netlist from input to output nodes in order to determine one or more arrival times with one or more sensitivities to selected process parameter variations.

BRIEF DESCRIPTIONS OF THE DRAWINGS

DETAILED DESCRIPTION

In the following detailed description of the embodiments of the invention, numerous specific details are set forth in order to provide a thorough understanding of the embodiments of the invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

The embodiments of the invention include a method, apparatus and system for a timing analysis of a physical design of circuits within an integrated circuit chip. In this context, timing analysis also includes considering the effect of crosstalk on the timing of the circuit. In other words, the reference to static timing analysis herein includes a "noise aware static timing analysis", although the techniques apply equally well to static timing analysis without noise considerations.

Figure 1A:
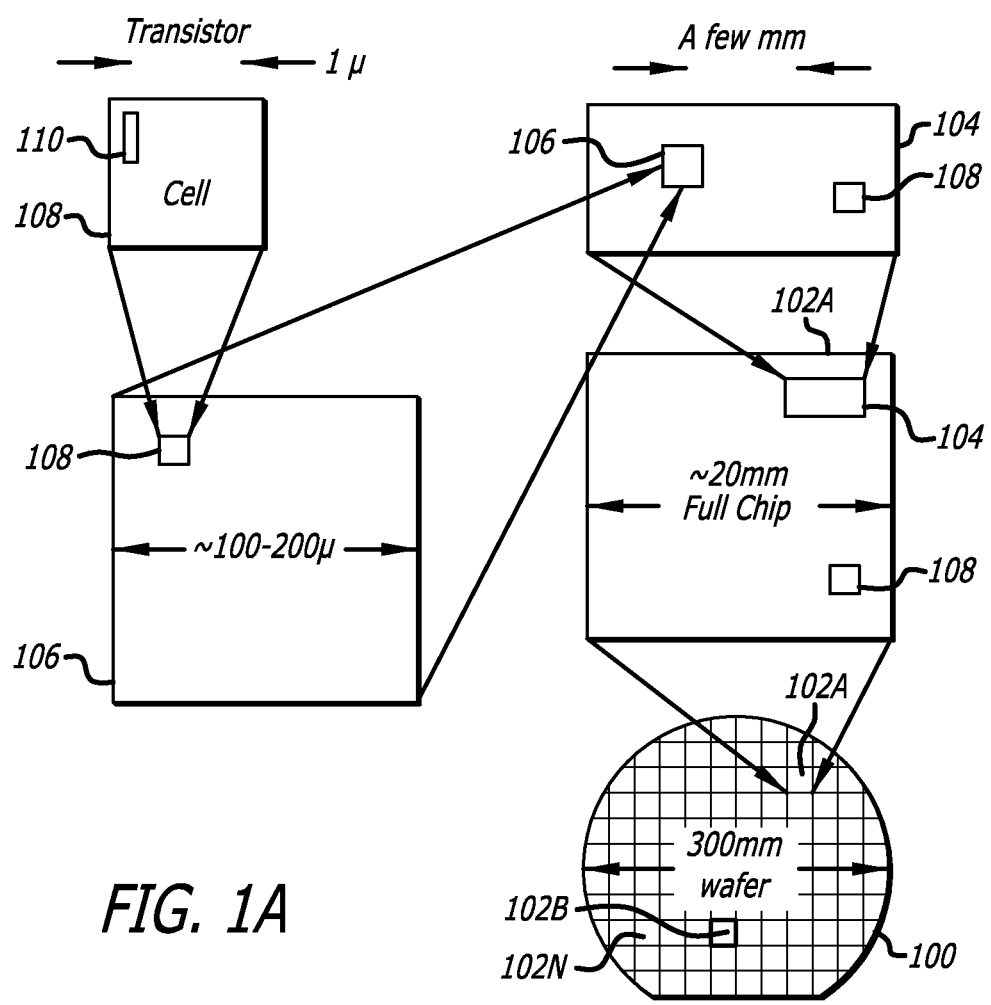
FIG. 1A is a diagram illustrating an exemplary hierarchy of an integrated circuit that is analyzed by the embodiments of the invention and stepped across a matrix of a wafer during its manufacture.

Referring now to FIG. 1A, a wafer 100 is illustrated with a plurality of integrated circuits 102A-102N formed therein in a matrix or rows and columns. FIG. 1A further illustrates a hierarchy of circuitry that may be used to define an integrated circuit 102A. Each complete integrated circuit ("full chip") 102A may include macro functional blocks 104 as well as lower level blocks and circuit cells. The macro functional blocks 104 for example may be processors, memory, or other types of functional blocks. The macro functional blocks 104 may be made of other smaller functional blocks 106 grouped together. The functional blocks 106, for example, may be registers, ALUs, control logic, random logic, or other types of functional blocks. The functional blocks 106 may be formed out of standard circuit cells 108 from a standard cell library.

A standard cell library typically includes a wide variety of types of standard circuit cells that provides basic low level functionality such as logic gates (e.g., AND, OR, XOR, INVERT, NAND, NOR, XNOR, BUFFER; multiplexer); basic storage logic (e.g., latch, flip flop, register, memory cell); input receivers, output drivers, and input/output buffers; tristate drivers; counters; etc. that are typically associated with an integrated circuit design. For each standard circuit cell in the standard cell library, information is provided regarding the cell dimensions, layers utilized, pin locations and layer, routing layers, netlist, and timing/delay information in a format that is known and read/writeable by IC CAD tools.

At a lowest level of an IC design and netlist are the active and passive electronic devices, such as transistors, resistors, and capacitors. Resistors and capacitors may be parasitic devices that were not intended to be a part of the design but are the result from manufacturing the semiconductor integrated circuit. One or more transistors 110 are typically used to form a standard circuit cell 108.

A plurality of the same standard circuit cell 108 may be used to form a functional block 106. For example, a set of sixteen D-type flip flop standard cells may be placed parallel to each other with control signals interconnected to form a sixteen bit register functional block. Alternatively, a mixture of types of standard circuit cells 108 may be combined to form a functional block. For example, a two bit adder may be formed of a combination of NAND, NOR, and INVERT standard cell circuits.

At a top level of an IC design and netlist, one or more functional blocks may be instantiated and coupled together with one or more standard cells from the cell library, such as an input receiver, output driver, and/or input/output (I/O) buffer. It is important that at the top level, the IC design meet its overall design specifications, including the overall timing specifications. A number of variations in semiconductor processing or manufacturing can effect the performance of an IC design, including its timing performance and signal integrity.

Variations in a semiconductor integrated circuit may result from the matrix (row and column) position of an integrated circuit on the wafer. These variations could be in the actual physical dimensions of the devices, or in the electrical properties of the devices. For example, the actual effective channel length of the same transistor (usually referred to as $L_{eff}$) may be different on different copies of the chip, depending on the position on the wafer. This can also then lead to differences in performance. For example, the performance of integrated circuit 102B near the center of the wafer 100 may differ from the performance of integrated circuit 102A nearer the edge of the wafer 100. This may be referred to as a chip-to-chip variation.

Variations in a semiconductor integrated circuit may also occur as a function of location within the integrated circuit die itself. For example, circuits that are placed near an edge of the integrated circuit die may have more defects and lower yield than circuits placed near the center of a die. Again, these variations could affect the actual dimensions or electrical properties of devices which are meant to be identical. For example, two transistors that are meant to be identical, occurring on different parts of the chip may have different effective channel lengths. As another example, a circuit placed in a crowded area of an integrated circuit may experience greater heating and provide lower performance than a circuit that is spaced apart with a lower level of heating to achieve a better performance. This variation found within the integrated circuit itself may be categorized as being an intra-chip variation. An intra-chip variation may be different at different locations of the same integrated circuit chip.

Figure 1B:
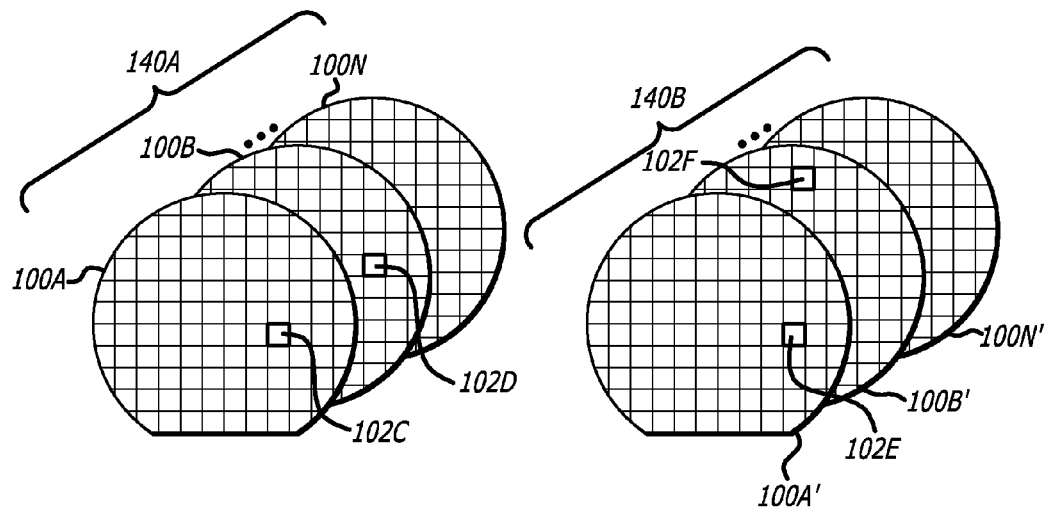
FIG. 1B is a diagram of a plurality of wafers in a pair of lots each including an integrated circuit design that is analyzed by the embodiments of the invention.

Referring now to FIG. 1B, a pair of manufacturing lots 140A-140B of wafers with the same integrated circuit design manufactured in a plurality of matrix positions is illustrated. Lot 140A includes N wafers 100A-100N. Lot 140B includes M wafers 100A'-100M'.

In addition to the matrix position, the performance of an integrated circuit may vary from wafer to wafer and from manufacturing lot to lot. For example, the performance of integrated circuit 102C on wafer 100A may differ from the performance of integrated circuit 102D on wafer 100B even though they are in the same matrix position (same row, column position) on each. For example, the performance of integrated circuit 102C on wafer 100A in Lot 140A may differ from the performance of integrated circuit 102E on wafer 100A' in Lot 140B even though they are in the same matrix position (same row, column position) on each wafer. It may be the case that the performance of integrated circuit 102F on wafer 100B' will differ more from the performance of integrated circuit 102E on wafer 100A' because they are at different matrix positions and on different wafers.

Figure 1C:
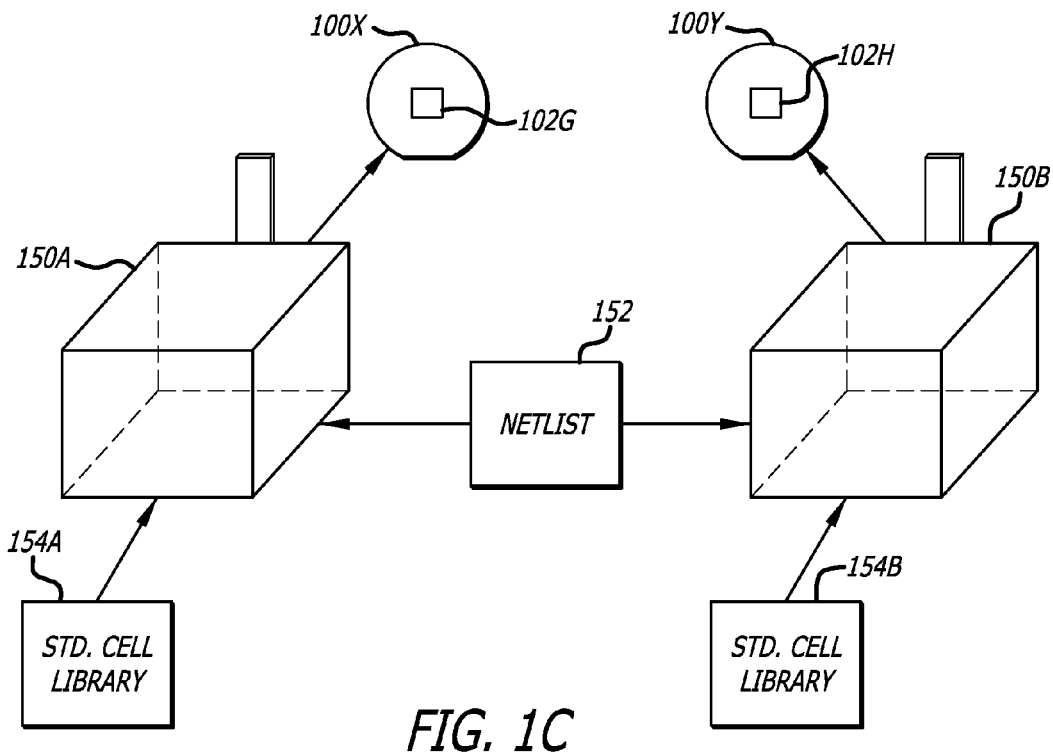
FIG. 1C is a diagram illustrating a pair of different wafer manufacturing facilities that may be used to manufacture an integrated circuit design that was analyzed by the embodiments of the invention.

Referring now to FIG. 1C, the integrated circuit design 152 is manufactured into silicon chips 102 across lots of wafers 100 in a manufacturing facility 150A-150B that may be referred to as a "wafer fab" or "fab". The fab 150A-150A in which the chip will be built may be unknown, and perhaps not yet constructed. Even if pre-existing, the wafer fab manufacturing performance and statistics may be time varying, such as from lot to lot or from wafer to wafer. Additionally, the IC design 152 may be manufactured in differing fabs 150A-150B so that the performance of the IC varies from fab to fab.

While the same IC design netlist 152, differing standard cell libraries 154A-154B may be used and provide performance variations. Even if the same standard cell library is used with the same IC design netlist, manufacturing differences in the fabs 154A-154B can cause variations in the performance of the integrated circuits 102G-102H from the respective wafers 100X-100Y manufactured in each.

Semiconductor process variations can effect both interconnect and device behavior on an integrated circuit. The semiconductor process variations may effect the behavior of interconnections or devices depending on where they are on an integrate circuit chip, where the integrated circuit chip is on a wafer, which wafer the integrated circuit chip is on in a lot, and also what manufacturing line (i.e., wafer fab) the lot and the particular wafer containing the integrated circuit was used in its manufacture. Exemplary semiconductor process variations are layer thickness (metal and dielectric layers) due to chemical mechanical planarization variations; dopant density, active area depth, and silicon thicknesses due to semiconductor deposition or implantation variations; and line widths and spacing due to lithographic and etching variations.

The embodiments of the invention relate to the field of static timing analysis. The objective of static timing analysis is to compute the performance of a given design, usually expressed as a timing report which lists the worst timing paths in a design. One objective of a number of embodiments of the invention is to consider semi-conductor process variations as well as environmental variations (principally power and voltage variations) in static timing analysis. Embodiments of the invention may be used to provide timing analysis, power analysis, signal integrity analysis and implementation analysis of an integrated circuit with the consideration of process variations.

In a traditional static timing analysis, the physical transition of a signal is represented (or modeled) by a pair of quantities, arrival time A and slew rate S in the set W represented by the equation:

$$W=\{A,S\}.$$

Here A, S represent, respectively, an arrival time and slew rate of a signal transition at a certain node of interest of the circuit. The transition W at a given node is computed using the signal transitions (including arrival time and slew rate information) at previous nodes and modeling of the subcircuit between two nodes of interest. The model typically includes a timing gate model with parasitic information.

The signal transitions are propagated forward through each stage of the circuit from its inputs to outputs. The arrival time at the output of a stage ($A_{out}$) of the circuit is calculated by adding delay D over the stage to the input signal arrival times ($A_{in}$) at the inputs of the stage which can be represented by the equations:

$$W_{out}=\{A_{out}, S_{out}\}$$

$$A_{out}=A_{in}+D$$

$W_{out}=\{A_{out}, S_{out}\}$ represents the signal transition at the output node, consisting of output arrival time $A_{out}$ and slew $S_{out}$, respectively. The delay over the stage, D, is calculated during the delay calculation using a gate model and parasitic information that is applies to output of the gate model.

The calculations described above for the output signal transition of a stage using stage delay and input transition constitutes a first set of atomic operations of the conventional statistical timing analysis often called propagation and denoted as PROP. In terms of transitions, the PROP operation can be written as the equation:

$$W_{in} \xrightarrow{PROP} W_{out}$$

The second operation, often called a MAX or MERGE operation, is applied to two or more transitions at the input of a stage to compute a single (worst case) transition at the output represented by the equation:

$$\{W_1, W_2, \ldots, W_K\} \xrightarrow{MAX} W_{MAX}$$

These two atomic operations, along with the transition, model define the particular type of statistical timing analysis. (See "Timing" by Sachin Sapatnekar, Kluwer Academic Publishers, 2004 for further information)

Then, the time at which a clock will cause a data value to be stored at a storage element is propagated backwards to create "required arrival times". The difference between a "required arrival time" and an "arrival time" is called "slack". In addition to these values, transition times or slew values are also propagated through the circuit. Nominal or worst case delay times and transition times are typically used to generate the worst case values for "required arrival time", "arrival time", and "slack'.

In modern technologies, crosstalk effects may also be considered during static timing analysis. This is due to the fact that signals that are routed close together have unintended electrical interactions, resulting in a change in the actual delay. For example, if a signal line is switching from a "logic 0" to a "logic 1" value (i.e. from voltage of 0 to voltage of Vdd), and a signal routed next to it is switching from a "logic 1" value to a "logic 0" value, then each signal can have the effect of slowing down the transition on the other signal. Similarly, if the signals are switching in the same direction, then they can speed each other up. These "crosstalk delay" effects, or "noise-on-delay" effects as they are sometimes called, may be considered in computing the circuit delays during static timing analysis. Although the embodiments of the invention are described herein without reference to crosstalk, all of the techniques may be considered to apply to static timing analysis with crosstalk considerations. For a detailed discussion regarding static timing analysis with crosstalk, see U.S. patent application Ser. No. 10/735,123, entitled Robust Calculation of Crosstalk Delay Change in Integrated Circuit Design, filed by Igor Keller et al. on Dec. 12, 2003, now issued as U.S. Pat. No. 7,359,843, which is incorporated herein by reference.

The conventional approach to considering process variations in static timing analysis is called statistical static timing analysis. In a statistical static timing analysis, the components of the transition model, arrival time (AT or A) and slew S, may be represented as linear functions of process parameters $p_k$ as follows $$A = A_0 + \sum_{k=1}^{K} a_k p_k$$

$$S = S_0 + \sum_{k=1}^{K} s_k p_k.$$

The set of parameters $\{p_k\}$ form a vector of process parameters p. The parameters $a_k, s_k$ are respectively the sensitivities of the arrival time and slew with respect to the process parameter $p_k$. Representation of arrival time and slew as linear functions of process parameters is analogous to representation of arrival time and slew as random quantities with a certain probability density function (PDF) which is related to the probability density function (PDF) of the process parameters.

In conventional statistical STA, the PDF is usually assumed to be that of normal distribution.

The two atomic operations PROP, MAX in conventional statistical STA are redefined to apply to the transition may be represented as a linear function of process parameters by the equations:

$$W_{in}(p) \xrightarrow{PROP} W_{out}(p), \{W_1(p), W_2(p), \ldots, W_n(p)\} \xrightarrow{MAX} W_{MAX}(p),$$

The PROP atomic operation may be implemented similarly to of conventional STA:

$$A_{out} = A_{in} + D_0 + \sum_{k=1}^{K}(a_k + d_k)p_k$$

Then, the delay over a circuit stage may also be represented and computed as a linear function of process parameters by the equation:

$$D = D_0 + \sum_{k=1}^{K} d_k p_k$$

The second atomic operation, MAX, of conventional statistical static timing analysis is defined differently. The MAX atomic operation involves calculation of resulting PDF using input PDFs based on a Clark formula (See H. Chang, S. S. Sapatnekar, "Statistical timing analysis considering spatial correlations using a single PERT-like traversal", IEEE ICCAD, pp. 621-625 November 2003; and C. Visweswariah, K. Ravindran, K. Kalafala, S. G. Walker, S. Narayan, "First-Order Incremental Block-Based Statistical Timing Analysis", Proc. 2004 DAC, pp. 331-336, June 2004 for additional information) by the following equation:

$$\{PDF_1, PDF_2, \ldots, PDF_n\} \xrightarrow{MAX} PDF_{MAX}$$

The output arrival time from the circuit stage is then extracted from the resulting $PDF_{max}$.

Conventional statistical static timing analysis can therefore be said to propagate probability distribution functions (PDF) through a circuit instead of nominal or worst case values for required arrival time, arrival time, and slack. The inputs used to calculate PDFs at every node of a circuit are the PDFs of the process parameters, as well as the nominal stage delay and input signal arrival times for the circuit.

As a result, the conventional approach to considering process variations in a static timing analysis suffers from the following disadvantages: (a) The exact impact of a process parameter on a timing quantity is not preserved, because it has to be expressed in terms of a specified probability distribution function; and (b) The analysis tool has built-in assumptions about the shape of the distributions of the process parameters, and if this is incorrect, then the analysis will be incorrect. The embodiments of the invention overcome these limitations.

Generally, the embodiments of the invention propagate all timing quantities as generic functions of process parameters (full timing value functions), without converting them to probability distribution functions and without any assumptions about the shape of the distributions.

Figure 2:
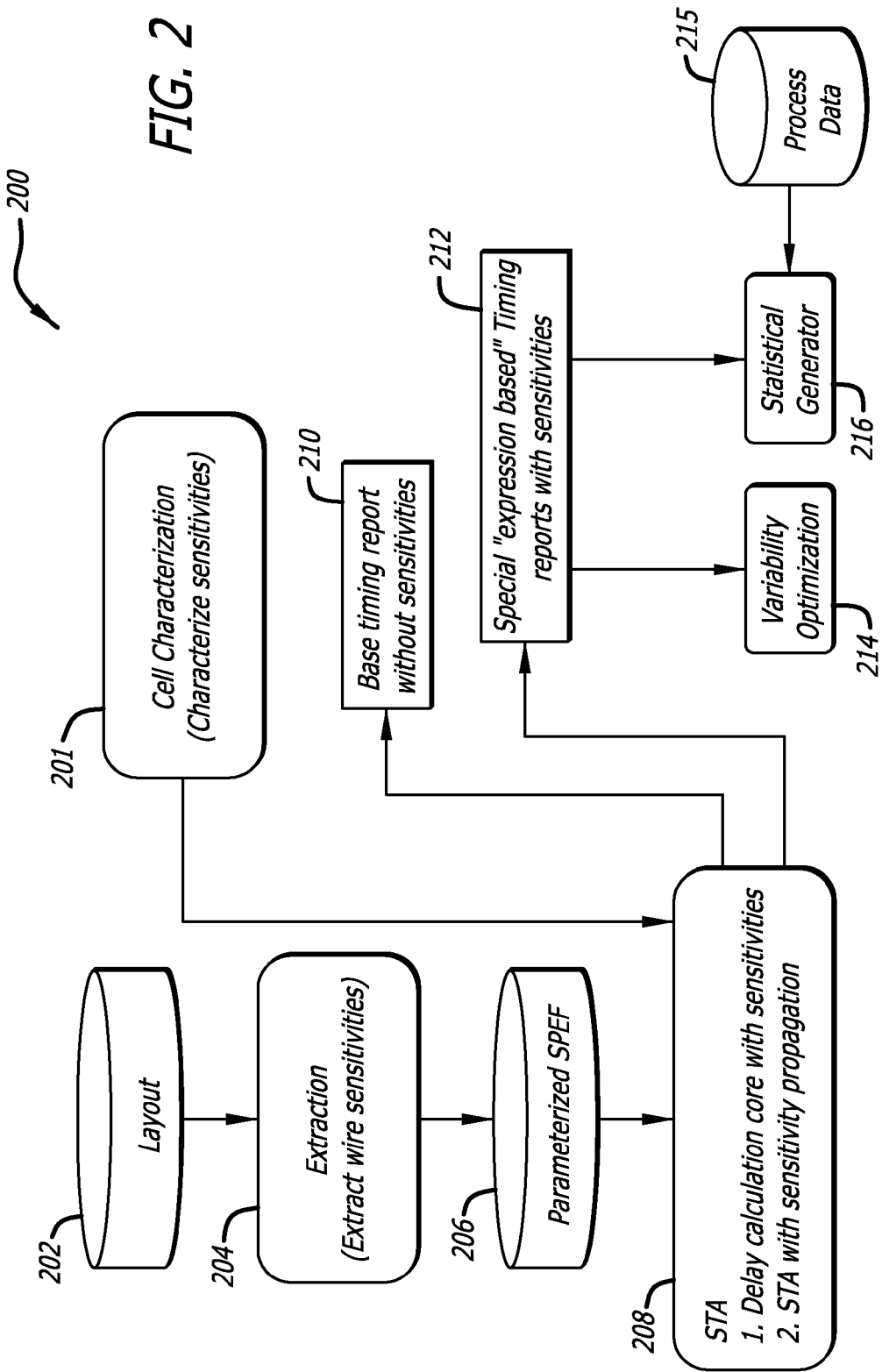
FIG. 2 is a system level flow chart of embodiments of the invention.
Figure 3:
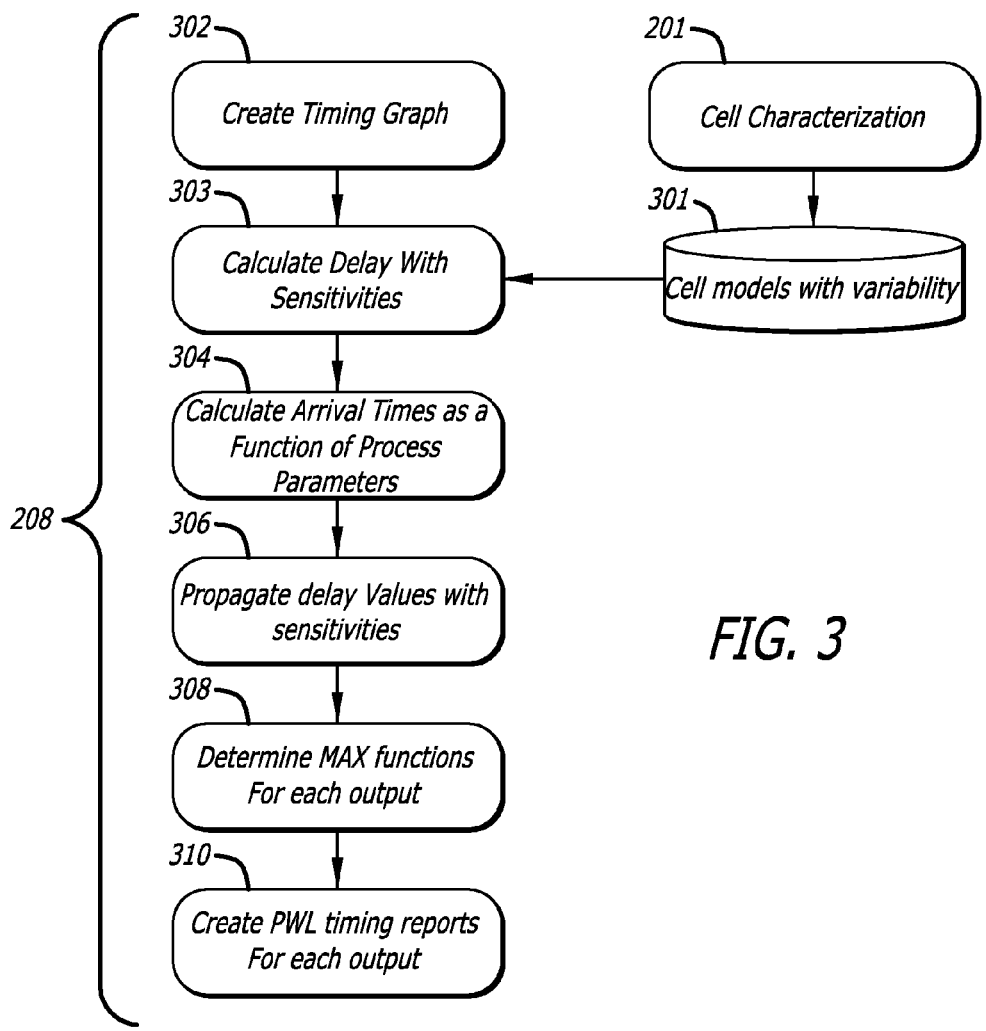
FIG. 3 is a flow chart of a method performed by embodiments of the invention.

Referring now to FIGS. 2 and 3, a method of propagating all timing quantities as functions of process parameters is now described. FIG. 2 illustrates a system level flow chart of embodiments of the invention. FIG. 3 is a flow chart of a method performed by embodiments of the invention.

At block 201, cell characterization of the one or more standard circuit cells in the standard cell library is performed. In addition to nominal delay calculation, this step also characterizes each cell for the effect of process variations in the performance of the cell. An appropriate subset of process parameters whose variation should be modeled is selected. For each cell type in the cell library, the sensitivity of each delay and transition time is modeled to variations in each process parameter. This results in a database or file 301 of circuit cell models with variability that is used in the statistical timing analysis of larger functional blocks or the full chip.

At block 204, an extraction of the interconnect of a database or file of an integrated circuit layout or netlist 202 is performed. An appropriate set of interconnect parameters whose variations should be modeled is selected. Typically, variations in metal thickness, metal width, and dielectric thickness per layer are modeled. Then, the interconnect parasitic elements or devices are extracted and the sensitivity of each interconnect parasitic element to variations in the selected set of interconnect parameters is determined. A parameterized SPEF file or database 206 is generated from the extraction of the interconnect parasitic elements and their sensitivities to the selected set of interconnect parameters.

At block 208, process variation-aware static timing analysis is performed on the layout netlist 202 using the parameterized SPEF file 206 that includes the sensitivities to the selected set of interconnect parameters. During a first process of block 208, in addition to conventional static timing analysis, calculation of delay values including sensitivities is performed. In a second process of block 208, the arrival time as a generic function of process parameters is computed (full timing value functions) and propagated through the timing graph. In one embodiment of the invention, the generic arrival time function (full timing value function) is a piece-wise linear function of process parameters.

Referring now to FIG. 3, at block 302, a timing graph is created from the netlist 202 of the integrated circuit.

At block 303, in topological order, the delay of each stage of the netlist 202 is calculated with the sensitivities being considered in response to the file or database 301 of cell models. Each stage is defined as having a driving cell that drives some interconnect and terminates at the input pin of another cell. Here, the result of the delay calculation of a stage is a base delay and the sensitivities of the delay to the selected process parameter variations. The base delay is the nominal value of the delay of the stage, without considering any process variations. The effective delay of the stage is given by a sum of the base delay and the sensitivity of each parameter multiplied by a variable describing the effective value of that variable. Other than initial stages at the inputs to the layout or netlist 202, each input slew value is of the same form.

At block 304, the arrival times are calculated using the arrival time equation as a function of process parameters. The arrival time functions at all nodes are computed by adding the delay as functions of the selected process parameters.

At block 306, the delays that are a function of the process parameters are propagated through the timing graph.

Figure 7A:
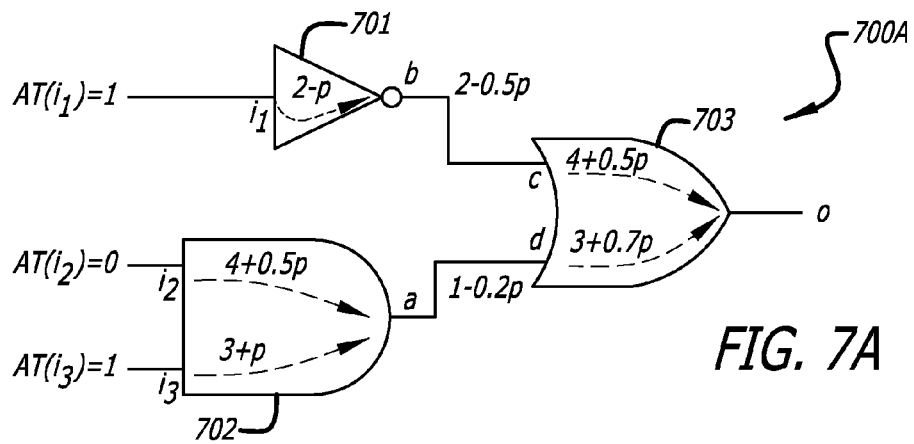
FIG. 7A illustrates a schematic diagram, a pictorial illustration of a netlist, of an exemplary circuit.

FIG. 7A illustrates a schematic, a pictorial representation of an exemplary netlist for an exemplary circuit 700A of a functional block. The exemplary circuit includes logic gates of an inverter 701, an AND gate 702, and an OR gate 703 coupled together as shown. A first input I1 is coupled to the input of the inverter 701. A second input I2 and a third input I3 are coupled to the first and second inputs of the AND gate 702. The NOR gate 703 has a first input c coupled to the output b of the inverter 701 and a second input d coupled to the output a of the AND gate 702 to generate signals on an output O.

The output of a clocked latch or D flip flop may be coupled to the inputs I1, I2, and/or I3 of the circuit 700A. The input of a clocked latch or D flip flop may be coupled to the output O of the circuit 700A.

Traditional methods of STA and the variation aware static timing analysis (VSTA) methods may be described with reference to the circuit 700A. For convenience we use a single process parameter p in FIG. 7A which is normalized to vary inclusively within the range of negative one and positive one (−1 to 1).

Exemplary gate delays from input to output are shown by the arcs inside the gates and are functions of the process parameter p in the embodiments of the invention. For example, the gate delay of the inverter 701 as a function of the process parameter is 2−p. The gate delay between the first input and the output of the AND gate 702 as a function of the process parameter is 4+0.5p. The gate delay between the second input and the output of the AND gate 702 as a function of the process parameter is 3+p. The gate delay between the first input c and the output of the OR gate 703 as a function of the process parameter is 4+0.5p. The gate delay between the second input d and the output of the OR gate 703 as a function of the process parameter is 3+0.7p.

Exemplary interconnect delays are shown next to the nets between the gates as functions of p. For example, the interconnect delay between the output b of the inverter 701 and the input c of the OR gate 703 as a function of the process parameter is 2−0.5p. The interconnect delay between the output a of the AND gate 702 and the input d of the OR gate 703 as a function of the process parameter is 1−0.2p.

Figure 7B:
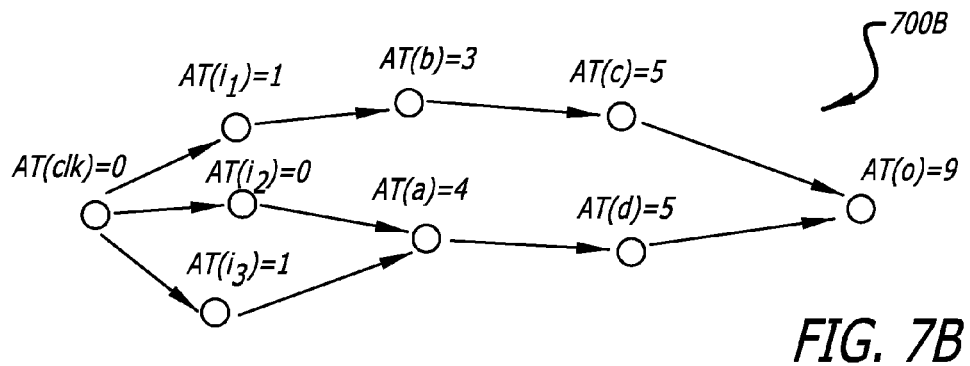
FIG. 7B illustrates a conventional timing graph for the exemplary circuit of FIG. 7A.

FIG. 7B illustrates a conventional timing graph 700B corresponding to the circuit 700A in FIG. 7A with the process parameter p being set to zero. A timing graph 700B is comprised of timing pins and timing arcs. Typically, the timing pins in a timing graph correspond to all interesting pins in the design. The arcs in a typical timing graph represent either connections within the cells and macro blocks from input to output or to wiring connections between pins of different cells or macro blocks.

The arrival times (ATs) in the convention timing graph 700B are propagated using the traditional STA methods for the nominal value of the process parameter where p=0. The arrival times (ATs) at each node of the timing graph is computed by adding the arrival time AT of a previous node with the arc delay through which the signal from the previous node has to propagate with p=0. This corresponds to the PROP operation used in conventional static timing analysis (STA). If there are more than one edge coming into the same timing node, a MAX operation is performed on two ATs to determine the worst case AT. For example, at the output a of the AND gate 702, there are two delay paths to node a. The arrival time at node a, AT(a) is the maximum arrival time between the two paths. In a first path propagating forward the arrival time AT(i2) to node a, the AT(a) is equal AT(i2) plus 4 which is equal to 0+4 or 4. In a second path propagating forward the arrival time AT(i3), the AT(a) is equal to AT(i3) plus 3 which is equal to 1+3 or 4. Had there been a difference between the two paths, the worst-case path would have been chose under the MAX operation. Using a conventional static timing analysis, the arrival time AT(o) at the output node o is equal to nine.

Figure 7C:
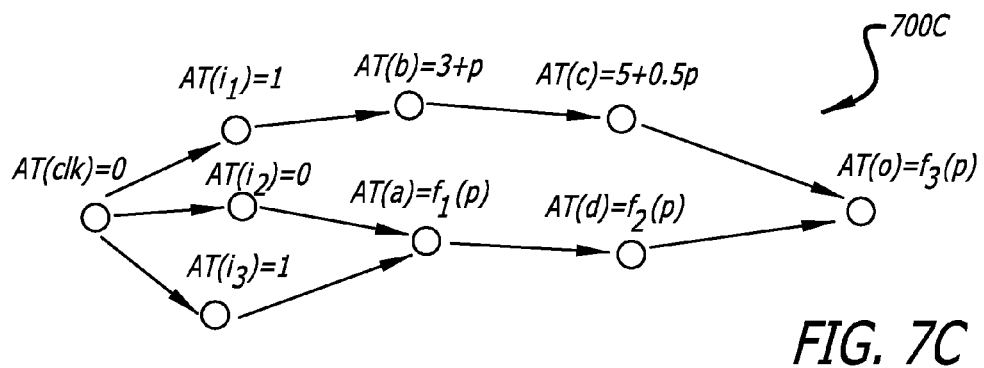
FIG. 7C illustrates an exemplary timing graph for the exemplary circuit of FIG. 7A in accordance with embodiments of the invention.

FIG. 7C illustrates an exemplary timing graph 700C corresponding to the circuit 700A and illustrated in accordance with the embodiments of the invention. The implicit method of propagation of arrival times (ATs) in the embodiments of the invention use variation-aware PROP and MAX operations in performing static timing analysis. It is assumed that arrival times at primary inputs such as $i_1$, $i_2$, $i_3$ are known and are not functions of a process parameter p. However, in contrast to the traditional STA methods, both the interconnect delay and gate (arc) delays are functions of the process parameter p. As a result, the arrival times (ATs) will also be functions of the process parameter p. Applying the PROP atomic operation on arrival times ATs at nodes by adding arc delays we obtain arrival times (ATs) at the respective outputs b and a of the inverter 701 and the AND gate 702 as indicated in the equations:

$$AT(b)=3+p$$

$$AT(a)=f_1(p)=4+0.5p.$$

Explicit propagation of the arrival times ATs further to nodes c,d simply adds the corresponding interconnect delays to ATs at nodes a,b respectively as indicated in the equations:

$$AT(c)=5+0.5p$$

$$AT(d)=f_2(p)=5+0.2p.$$

Propagating the arrival times ATs from nodes c,d through the OR gate 703 to the output node o is performed by adding corresponding arc delays and applying a MAX operation. As a result, the arrival time AT(o) at node o becomes a piece-wise linear function of p:

$$AT(o)=f_3(p)=\begin{cases}9-p, & p<0.5 \\ 8+p, & p>0.5\end{cases}$$

If process parameter p is zero, the arrival time AT(o) reduces to the maximum of nine, same as that of the conventional STA. However, for non-zero values of p the AT can be different from nine. Thus, accounting for process variations in the propagation of arrival times (AT) as a function of process parameters p can lead to different timing results.

In contrast to other MAX atomic operations, which are based on input probability density functions (PDFs), a new MAX atomic operation is introduced and applied to generic input arrival time functions to yield a single latest arrival time function. In the embodiments of the invention, a plurality of generic input arrival time functions are converted to output arrival time functions (full timing value functions) using the new MAX operation that assures that the output arrival time function represents the latest arrival time given the defined values of process parameters. This is in contrast to a "timing distribution", a form of statistical distribution that is essentially computed at each stage or node of a netlist in conventional statistical timing analysis. However, at selected output nodes, a statistical distribution can be derived from the propagated arrival time functions. The statistical distribution is derived via a statistical convolution of the arrival time functions with PDFs of each process parameter.

The new MAX atomic operation (implicit propagation) is now described as corresponding to a piece-wise linear (PWL) function of process parameters for an arrival time function (AT), a piece-wise liner arrival time (PWL-AT) function, in one embodiment of the invention. However, it is to be understood that the new MAX atomic operation is not to be so limited to PWL representations only. The new MAX atomic operation may be represented by other functions.

The PWL AT function for the new MAX atomic operation can be described by a list of pairs consisting of a linear arrival time functions (AT) and corresponding subspace (or validity range) of process parameters. The PWL AT function for the new MAX atomic operation may be defined by the equation $A_{PWL}$:

$$A_{PWL}=\{A_1(p),\Pi_1\},\{A_2(p),\Pi_2\}\ldots,\{A_N(p),\Pi_N\}$$

In the equation for $A_{PWL}$, $\Pi_k$ is a validity range of parameters where the linear function $A_k$ that may be defined over a normalized range of process parameter variations, vector p.

Figure 8A:
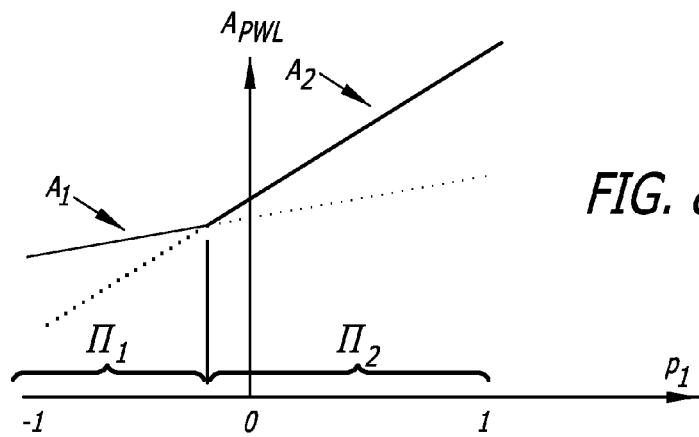
FIG. 8A illustrates an exemplary graph of a pair of piece-wise linear functions for two linear arrival times and corresponding valid ranges of normalized process variation P for each.

Referring now to FIG. 8A, an exemplary PWL AT function is illustrated for $A_{PWL}$. The exemplary PWL AT function is a two-piece linear arrival time function having two corresponding validity ranges $\Pi_1$ and $\Pi_2$ where the arrival time functions $A_1$ and $A_2$ are respectively defined. That is, if p is in the range $\Pi_1$ then the arrival time function A1 provides the values for $A_{PWL}$ and if p is in the range $\Pi_2$ then the arrival time function $A_2$ provides the values for $A_{PWL}$. While pieces of two linear arrival time functions were used to describe the overall $A_{PWL}$, it is to be understood that additional arrival time functions may be used to generated $A_{PW}$.

A piece-wise linear slew rate function (PWL-SLEW) can be similarly formed as that of the piece-wise linear arrival time function (PWL-AT) described previously based on linear slew rate functions. With the PWL-AT and PWL-slew functions, a piece-wise linear MAX atomic operation (PWL-MAX) may be defined on a signal transition $W_{PWL}$.

The PWL-MAX atomic operation may be defined on a transition $W_{PWL}$ with the process variable P by the equation $W_{PWL,MAX}(P)$:

$$\{W_{pwl,1}(p), W_{pwl,2}(p), \ldots, W_{pwl,N}(p)\} \xrightarrow{MAX} W_{pwl,MAX}(p)$$

The PWL-MAX atomic operation may be defined in the embodiments of the invention by three actions or steps as follows: (a) determine the validity range $\Pi$ of the variable P for each initial PWL-AT function; (b) prune some of the PWL-AT functions based on a criterion of worst case; and (c) simplify by approximating several PWL-AT functions with fewer (one or more) PWL-AT functions (simplification step). The PWL-SLEW functions may be similarly treated.

The PWL-MAX operation produces a transition model $W_{PWL,MAX}(P)$, which, being a function of one or more process variables, is useful in determining timing delay at a node with multiple paths during a variation aware static timing analysis. The following is a more detailed description of each step or action in generating the PWL-MAX atomic operation.

In the first step, for each of the original PWL-ATs a range of process parameters p are identified in which the value of $A_{PWL}$ over the PWL-ATs is larger than all other PWL-ATs, if at all. The range of process parameters over which the given PWL-AT is greater than others is the validity range for this PWL-AT. FIG. 8A exemplifies this step by finding the validity ranges for two linear arrival time (AT) functions. In FIG. 8A over the range $\Pi_1$ of process variables P, the linear arrival time function $A_1$ has a greater $A_{PWL}$ value than the linear arrival time function $A_2$. Over the range $\Pi_2$ of process variables p, the linear arrival time function $A_2$ has a greater $A_{PWL}$ value than the linear arrival time function $A_1$. Note that FIG. 8A is only exemplary, other linear arrival time functions may be used with differing validity ranges and different variables, such as environmental variables.

In the second step, the linear arrival time functions with a zero or lower values of $A_{PWL}$ or a very small validity range $\Pi$ are pruned from the PWL-AT for $A_{PWL}$. Typically, arrival times are pruned out based on a direct comparison of arrival time values at a single process point. However as is the case for the embodiments of the invention where the arrival time is a function of process parameters p, an arrival time function Ai may be pruned out if its arrival time values $A_{PWL}$ are less than arrival time values for other arrival time functions over any point of process parameter space p.

Figure 8B:
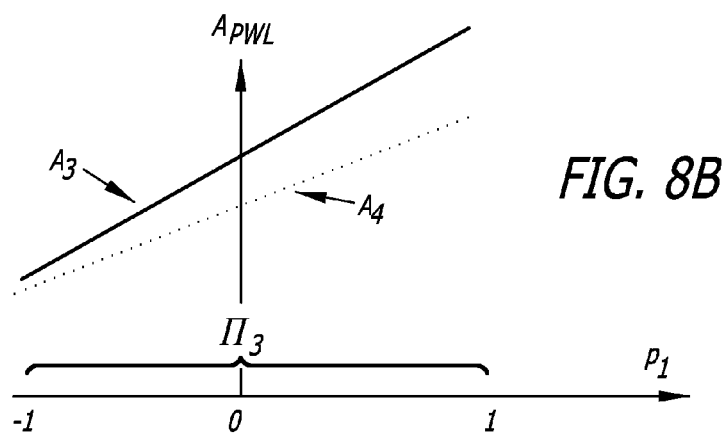
FIG. 8B illustrates an exemplary graph of a pair of arrival time functions, one of which is to be pruned to form a piece-wise linear arrival time function over a range normalized range of process variation.

FIG. 8B illustrates an example of pruning out an arrival time function A4. In FIG. 8B, the arrival time values for the linear arrival time function $A_3$ are greater than arrival time values for the arrival time function $A_4$ over the entire range $\Pi_3$ of a single process variable P of parameter ( ). In this case the linear arrival time function $A_4$ can be pruned as its values for arrival time are all less than those for the linear arrival time function $A_4$. While a single process variable has been used in the exemplary FIG. 8B for simplicity of illustration, additional process variables may be considered in the arrival time functions.

In the third step, the plurality of linear arrival time functions making up the pieces of the PWL-AT formed during the first and second steps are reduced to a simplified PWL-AT. The PWL-AT is simplified by finding an PWL-AT function with fewer pieces of linear arrival time functions then the original collection and which approximates or bounds (in some sense) the original collection or linear arrival time functions forming the PWL-ATs.

Figure 8C:
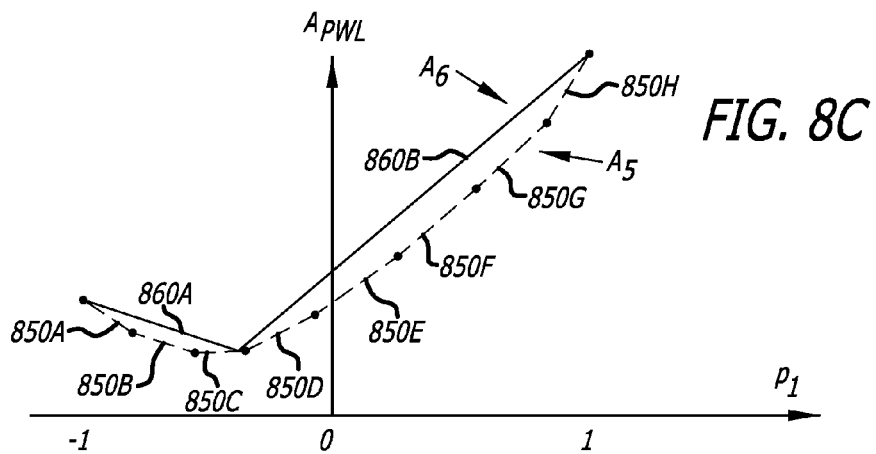
FIG. 8C illustrates an exemplary graph of the simplification of a piece-wise linear arrival time function over a valid range.

Referring now to FIG. 8C, an exemplary simplification process is illustrated. The initial PWL-AT function $A_5$ is very detailed consisting of eight pieces 850A-850H of linear arrival time functions. This can be simplified to the PWL-AT function $A_6$ which is less detailed consisting only of two pieces 860A-860B of linear arrival time functions.

Note that the simplification is achieved via approximation. The approximation can be based on different methods and correspond to different goals of the static timing analysis (STA). Likewise, we can consider the two most popular particular cases of simplification, which correspond to today's traditional multi-corner static timing analysis (STA) and statistical static timing analysis (SSTA), respectively. In the case of multi-corner STA, the simplification is done in such a way as to preserve the value of arrival times (AT) at all corners of process parameter range. On the other hand, simplification may be performed in such a way that the PWL-AT function is approximated by a single linear function. In this case, the first two moments of combined probability distribution functions are preserved to correspond to traditional statistical static timing analysis.

By choosing different methods or ways of approximating a detailed PWL-AT with a simpler PWL-AT (even linear AT) one can reproduce two specific types of STA: multi-corner STA and statistical STA.

At block 308, the required arrival time and slack time of each output of the timing graph is computed by determining the maximum arrival time function for each output. This is similar to the above computation, except that, the required arrival times are propagated backwards from the arrival time of the clocks at the clocked latches or D flip-flops.

At block 310, piece-wise linear timing reports are created for each output of the timing graph. The timing reports are created from the arrival time and slack time functions computed previously. A base timing report 210 without consideration of process variations may be generated. Additionally, specific distributions can be applied to each of the selected process parameters to generate special "expression based" timing reports with sensitivities 212. Other expression based timing reports with sensitivities can also be generated, to which statistical distributions of process parameters can be applied to generate distributions for timing quantities such as slack and arrival time.

With the special "expression based" timing reports with sensitivities 212, variability optimization may be performed on the layout netlist 202. If process data 215 is provided, statistics may be generated by a statistical generator 216 in response to the timing report with sensitivity 212.

Figure 4:
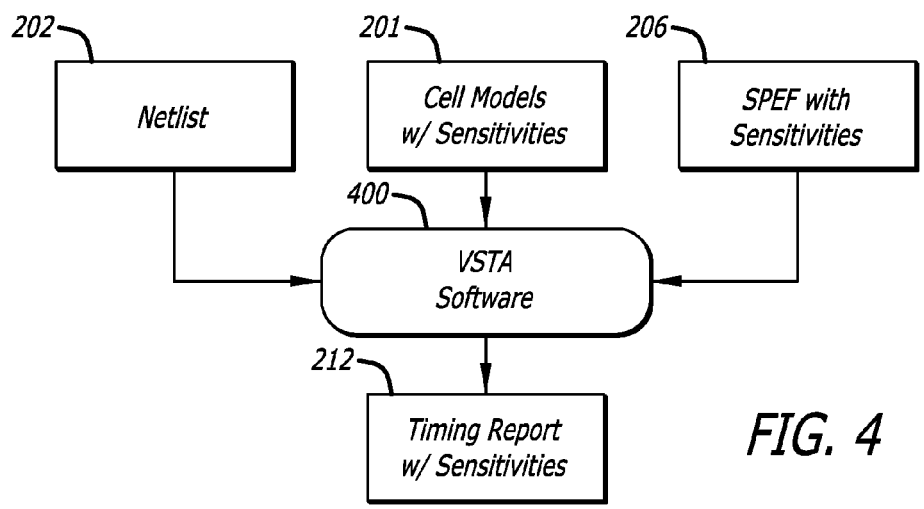
FIG. 4 is a block diagram illustrating information coupled into and out of the variation aware statistical timing analysis (VSTA) software.

Referring now to FIG. 4, a block diagram illustrates information coupled into and the resultant output from the variation aware statistical timing analysis (VSTA) software 400.

The VSTA software 400 receives a circuit netlist 202; a cell library 201 including circuit cell models with sensitivities of selected process variations; and netlist parasitics file 206 with it sensitivities to selected process variations, such as interconnect variations. The netlist parasitics file 206 may be in a number of different file formats such as a standard parasitics exchange format (SPEF), or other standard parasitics format (SPF), such as the detailed standard parasitics format (DSPF). The circuit netlist 202 may be a netlist for a functional block, a full integrated circuit chip, or other hierarchical level thereof.

With these inputs, the VSTA software 400 can generate a timing report 212 for the circuit netlist 202 with sensitivities to the selected process variations. The timing report 212 may be graphically presented to a user on a monitor or printed out onto paper. The timing report may be waveforms illustrating the input stimulus that generates a delay in the output. It may also be summarized numerically by providing the numeric values of the arrival time and slew rate of each selected output or node.

Figure 5:
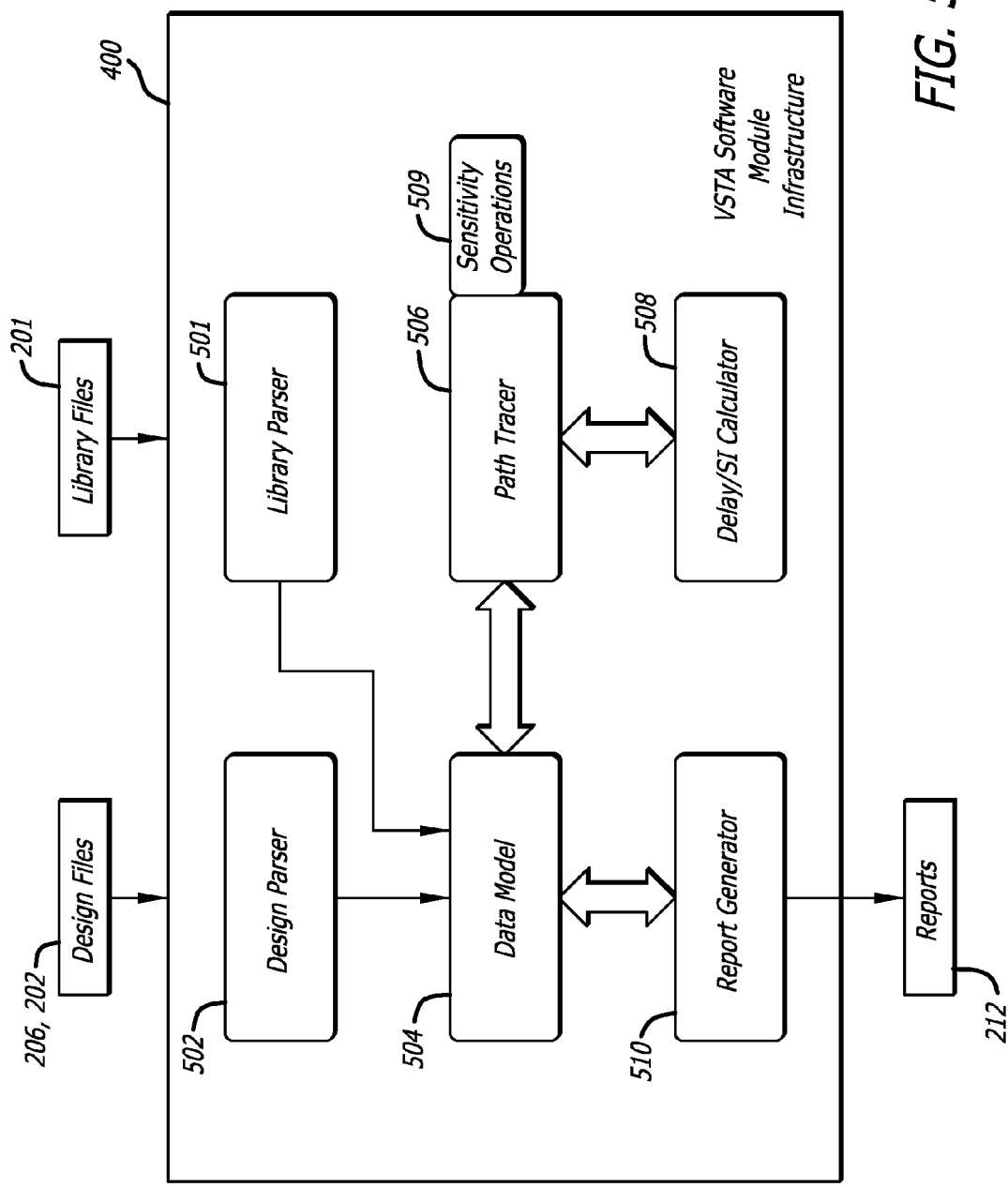
FIG. 5 is a block diagram of software modules of the VSTA software.

Referring now to FIG. 5, a block diagram of software modules of the VSTA software 400 is illustrated. The VSTA software 400 may include software modules of a library parser 501, a design parser 502, a data modeler 504, a path tracer 506, a delay/signal integrity calculator 508, a sensitivity operations module 509, and a report generator 510.

The library parser 501 receives the cell library files 201 including the circuit cell models and their sensitivities of the selected process variations. The library parser 501 parses those cell models that are instantiated by the circuit netlist 202 for use by the data modeler 504. The design parser 502 receives the circuit design files including the circuit netlist 202 and the netlist parasitics 206. The design parser 502 parses the circuit netlist 202 and includes the netlist parasitics 206 for use by the data modeler 504.

The data modeler 504 combines the circuit netlist and adds the circuit cell netlist with its sensitivities to generate a data model of the overall circuit design for analysis. The data modeler 504 provides the data model of the overall circuit to the path tracer module 506. One component of the data model is the "timing graph", which is used by the path tracer module 506.

The path tracer module 506 receives the timing graph data model to trace out paths from input to output for a delay/SI analysis along the traced paths in accordance with the methods previously described. The path tracer module adds up delays calculated by the delay/SI calculator from one stage of the netlist to the next to compute a path delay. That is, the path tracer module adds up the plurality of arrival time functions that are propagated through the timing graph, that corresponds to circuit netlist 202, to the desired output node.

The delay/SI calculator 508 receives stages of the circuit netlist along a path from the path tracer module. The delay calculator performs a delay/SI calculation for each stage of the circuit in the context of its load. The delay/SI calculator 508 uses the circuit cell delays with its respective process variation sensitivities, and the parasitics file of the interconnections with its respective process variation sensitivities to perform the delay/SI calculation for each stage of the circuit. The delay/SI calculator 508 couples the results of the delay/SI calculation for each stage of the circuit back to the path tracer 506 so that it can add up the delays in the netlist.

The sensitivity operations module 509 implements various operations to be performed on sensitivity functions, such as computation of max functions and path pruning described herein.

With the data model completed by the data modeler 504, the paths all traced by the path tracer 506, and the delays calculated for each by the delay/SI calculator 508, this information is passed to the report generator 510 to generate the desired type of report 212 for the timing paths in the circuit netlist 202.

Figure 6:
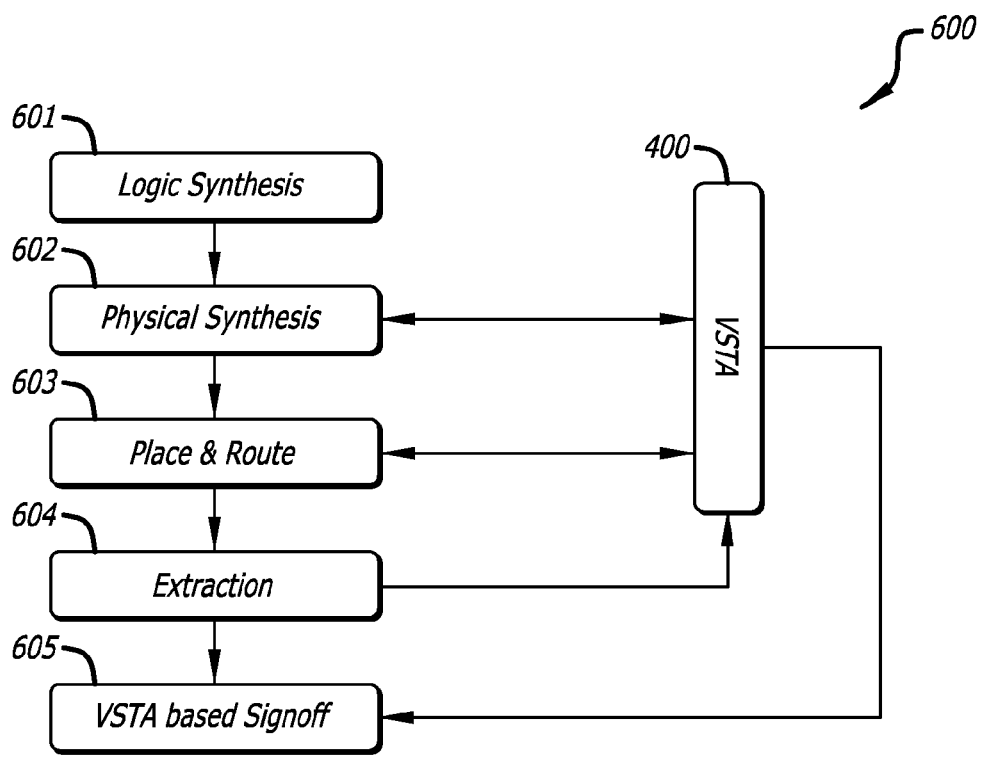
FIG. 6 is a flow chart of an integrated circuit design system that includes the VSTA software.

Referring now to FIG. 6, a flow chart of an integrated circuit design system 600, an ECAD design flow, including the VSTA software 400 is illustrated.

Initially in the design of the integrated circuit, the logical functionality is created during logic synthesis 601. The logical functionality may be represented by a logical description such as through a high level description language (HDL) or verilog format.

At block 602, physical synthesis of the logical description is performed to generate a hierarchical circuit netlist that selects certain circuit cells of the cell library 201 and describes the interconnections between each cell. The circuit netlist 202 is coupled to the VSTA software 400.

At block 603, placement and routing of the circuit cells of the cell library 201 may be performed to form graphical data representing mask layers of the semiconductor integrated circuit to form the circuits and the wire routes there between in the wafer fab. The VSTA software may analyze the placement of the circuit cells and their interconnections to be timing requirements are met without regard to interconnect parasitics.

With the graphical data of the placement and routing, the parasitics of the wire routes may be extracted at block 604. Additionally, the parasitics of the interconnections may be analyze to generate its respective sensitivities to semiconductor process variations and form the parasitics file 206 that is coupled into the VSTA software 400.

If the resultant timing report output of the VSTA software 400 is acceptable, the graphical data of the placement and routing representing the integrated circuit may be signed off at block 605 by an engineer as being acceptable for manufacture in a wafer fab.

While the details of performing a static timing analysis of a circuit has been previously described, the embodiments of the invention are also applicable to performing a signal integrity analysis to evaluate the effect of noise on each signal propagating between logic gates, including noise from the crosstalk of other signals that may be coupled to a signal line.

Figure 9:
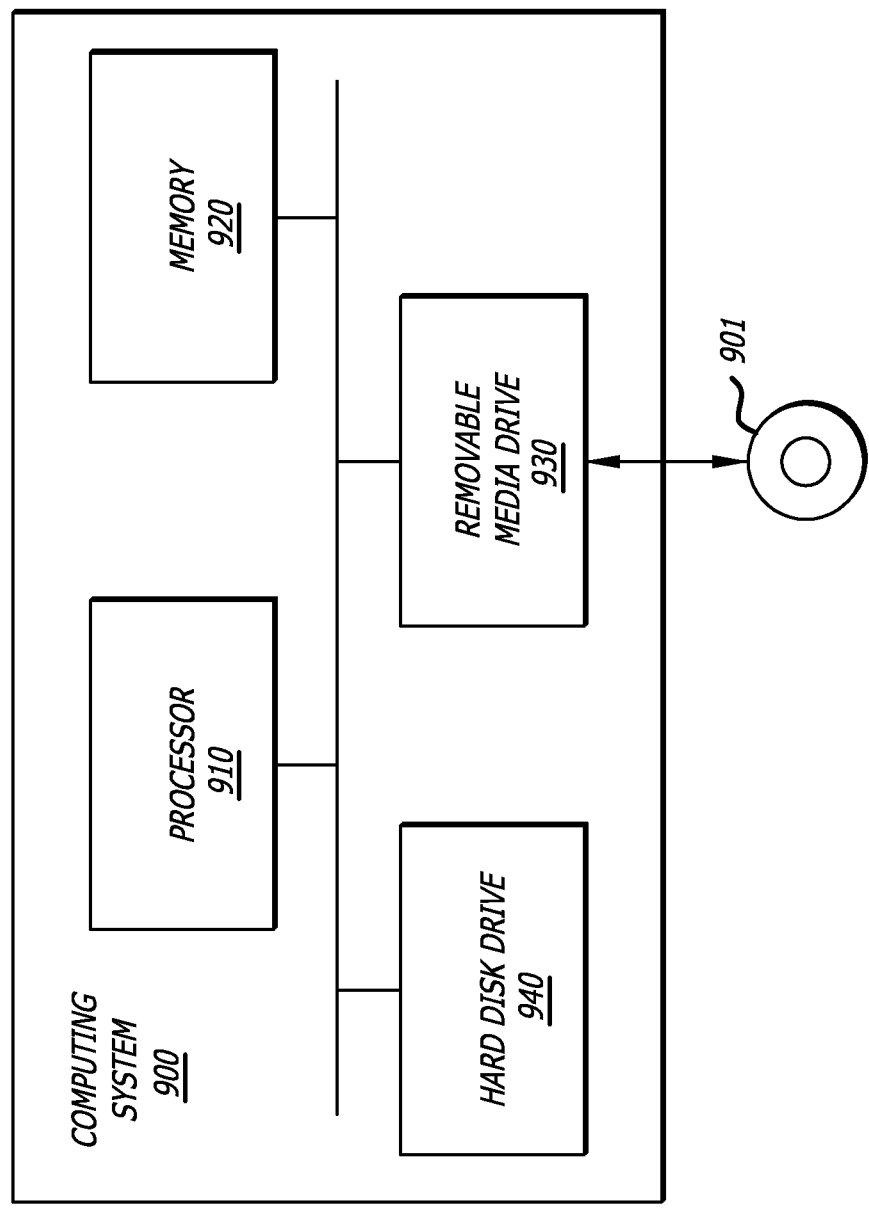
FIG. 9 illustrates an exemplary embodiment of a computing system usable with embodiments of the invention.

Referring now to FIG. 9, a computing system 900 is illustrated that may be used to perform some or all of the processes in accordance with a number of embodiments of the invention. In one embodiment of the invention, the computing system 900 includes a processor 910, a memory 920, a removable media drive 930, and a hard disk drive 940. In one embodiment, the processor 910 executes instructions residing on a machine-readable medium, such as the hard disk drive 940, a removable medium 901 (e.g., an optical medium (compact disk (CD), digital video disk (DVD), etc.), a magnetic medium (magnetic disk, a magnetic tape, etc.), or a combination of both. The instructions may be loaded from the machine-readable medium into the memory 920, which may include Random Access Memory (RAM), dynamic RAM (DRAM), etc. The processor 910 may retrieve the instructions from the memory 920 and execute the instructions to perform the operations described above.

Note that any or all of the components and the associated hardware illustrated in FIG. 9 may be used in various embodiments of the system 900. However, it should be appreciated that other configurations of the system 900 may include more or less devices than those shown in FIG. 9.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The embodiments of the invention also relates to an apparatus for performing the operations described herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will appear from the description below. In addition, the embodiments of the invention are not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

When implemented in software, the elements of the embodiments of the invention are essentially the code segments to perform the necessary tasks. The program or code segments can be stored in a processor readable medium or transmitted by a computer data signal embodied in a carrier wave over a transmission medium or communication link. The "processor readable medium" may include any medium that can store or transfer information. Examples of the processor readable medium include an electronic circuit, a semiconductor memory device, a read only memory (ROM), a flash memory, an erasable programmable read only memory (EPROM), a floppy diskette, a CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

Along nodes of a timing graph, delay values may be computed that include a cross talk noise effect from adjacent signal lines. For selected output nodes of a netlist, noise glitches may be propagated with a full functional representation to perform a crosstalk glitch analysis.

Noise values may be computed along the nodes of the timing graph including sensitivities to process variations. For selected output nodes of the netlist, noise glitches with the sensitivities may be propagated to the selected output nodes. A parameterized noise report may be generated including the sensitivities to the process variations. The noise glitches are cross talk noise and the parameterized noise report is a cross talk glitch analysis.

Not only do embodiments of the invention consider semiconductor process variations but also environmental variations, such as temperature, power, and power supply voltage variations, in a static timing analysis. Accordingly, each circuit cell of the cell library may also be characterized for sensitivity to environmental parameter variations. With the characterized circuit cells, delay values along nodes of a timing graph may be computed including the sensitivities to environmental variations. A parameterized timing report can be generated that includes sensitivities to semi-conductor process variations as well as sensitivities to the environmental variations.

While certain exemplary embodiments have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art. Rather, the embodiments of the invention should be construed according to the claims that follow below.

What is claimed is:

1. A variation aware static timing analysis tool for integrated circuit (IC) design, the tool comprising:
one or more parser software modules to receive an integrated circuit netlist, a circuit cell library, and interconnect parasitics associated with the integrated circuit netlist, the circuit cell library including circuit cell sensitivities to one or more semiconductor process variations, the interconnect parasitics including parasitic sensitivities to the one or more semiconductor process variations;
a data modeler software module in communication with the one or more parser software modules to receive the integrated circuit netlist, the data modeler software module to add circuit cell netlists of the circuit cell library with their sensitivities into the integrated circuit netlist to generate a data model of the overall integrated circuit design for analysis;

a delay calculator software module to receive circuit cell delays with their respective process variation sensitivities and the interconnect parasitics with its respective process variation sensitivities associated with the interconnections, the delay calculator software module to perform a delay calculation for each stage of the data model of the overall integrated circuit design in response thereto; and a path tracing software module in communication with the delay calculator to receive the delay calculation for each stage of the data model of the overall integrated circuit design and the data modeler to receive the data model of the overall integrated circuit design, the path tracing software module to add up the delays of each stage in at least one path of the integrated circuit netlist in response to the data model and the delay calculation for each stage of the data model.

2. The variation aware static timing analysis tool of claim 1, further comprising:

a report generator software module in communication with the data modeler software module, the delay calculator software module, and the path tracing software module, wherein the report generator software module to generate a timing report of at least one output node of the circuit netlist, the timing report including timing sensitivities to the one or more semiconductor process variations.

3. The variation aware static timing analysis tool of claim 1, wherein the one or more parser software modules includes a design parser software module to receive the integrated circuit netlist and the interconnect parasitics, the design parser software module to parse the integrated circuit netlist and include interconnect parasitics therein for use by the data modeler software module; and a library parser software module to receive the integrated circuit netlist and the circuit cell library, the library parser software module to parse the circuit cell library for models of the circuit cell instantiated by the integrated circuit netlist for use by the data modeler software module.

4. The variation aware static timing analysis tool of claim 1, further comprising:

a sensitivity operations software module in communication with the path tracer software module, the sensitivity operations software module to compute max functions and perform path pruning of timing functions along a path.

5. The variation aware static timing analysis tool of claim 1, wherein the data model is a timing graph; and the path tracer software module traces out the at least one path from input to output along the timing graph forming a plurality of stages of the integrated circuit netlist along the at least one path.

6. The variation aware static timing analysis tool of claim 5, wherein the delay of each stage is represented by an arrival time function; and the path tracer software module adds up a plurality of arrival time functions along the at least one path of the timing graph to a desired output node.

7. The variation aware static timing analysis tool of claim 6, further comprising:

a sensitivity operations software module in communication with the path tracer software module, the sensitivity operations software module to compute max functions and perform path pruning of timing functions along a path.

* * * * *